United States Patent
Kobayashi

(10) Patent No.: US 12,302,502 B2
(45) Date of Patent: May 13, 2025

(54) ELECTRONIC COMPONENT PACKAGE

(71) Applicant: Murata Manufacturing Co., Ltd., Nagaokakyo (JP)

(72) Inventor: Tomofumi Kobayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 18/118,178

(22) Filed: Mar. 7, 2023

(65) Prior Publication Data

US 2023/0320052 A1  Oct. 5, 2023

(30) Foreign Application Priority Data

Mar. 10, 2022  (JP) .................. 2022-037392

(51) Int. Cl.
*H05K 13/00*   (2006.01)
*H01G 4/248*   (2006.01)
*H01G 4/30*    (2006.01)

(52) U.S. Cl.
CPC ......... *H05K 13/0084* (2013.01); *H01G 4/248* (2013.01); *H01G 4/30* (2013.01)

(58) Field of Classification Search
CPC .......... H01G 2/065; H01G 4/248; H01G 4/30; H05K 9/00; H05K 9/0079; H05K 13/00; H05K 13/0084; H05K 13/02; H05K 13/04; H05K 13/0419
USPC ....................................................... 206/714
See application file for complete search history.

(56) References Cited

U.S. PATENT DOCUMENTS

| 5,960,961 | A | * | 10/1999 | Gutentag | H05K 13/0084 206/716 |
| 6,179,127 | B1 | * | 1/2001 | Kato | H05K 13/0084 206/725 |
| 6,860,391 | B2 | * | 3/2005 | Kawada | H05K 13/0417 206/701 |
| 8,210,357 | B2 | * | 7/2012 | Masuda | H05K 13/0084 206/714 |
| 9,873,555 | B2 | * | 1/2018 | Mariani | H01L 23/053 |
| 11,737,251 | B2 | * | 8/2023 | Shimizu | H05K 13/02 361/212 |
| 2021/0144889 | A1 | | 5/2021 | Shimizu | |

FOREIGN PATENT DOCUMENTS

| JP | S60047275 U | 4/1985 | |
| JP | H10287387 A | 10/1998 | |
| JP | 2007076713 A | 3/2007 | |
| JP | 2011195161 A | * 10/2011 | |
| JP | 2021075315 A | 5/2021 | |
| JP | 2021-155077 A | 10/2021 | |
| KR | 1020120099944 A | 9/2012 | |
| WO | WO9004915 A1 | * 5/1990 | H05K 13/00 |

OTHER PUBLICATIONS

Office Action in JP2022-037392, dated Mar. 12, 2024, 2 pages.

* cited by examiner

*Primary Examiner* — Bryon P Gehman
(74) *Attorney, Agent, or Firm* — Keating & Bennett, LLP

(57) ABSTRACT

An electronic component package includes a base tape including recesses. On an inner surface of each of the recesses, a protrusion that can abut an electronic component inside of the recess is provided. The electronic component includes a multilayer body having a parallelepiped or substantially parallelepiped shape and an external electrode on each of two end surfaces of the multilayer body.

15 Claims, 13 Drawing Sheets

FIG.3
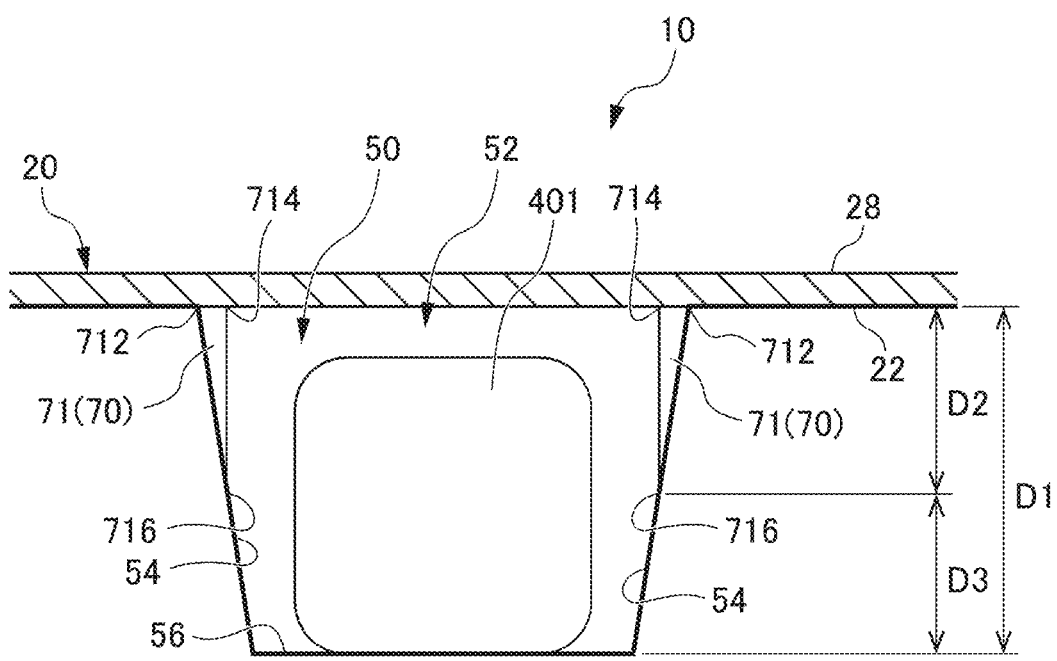
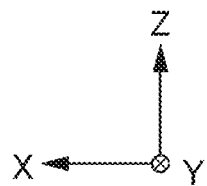

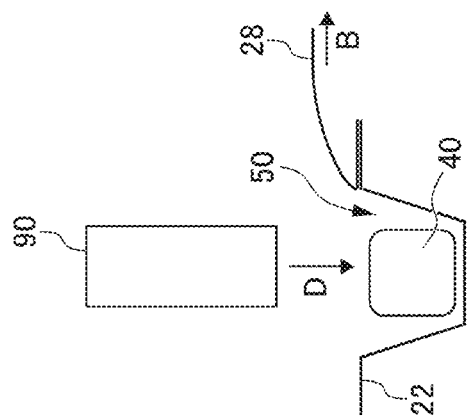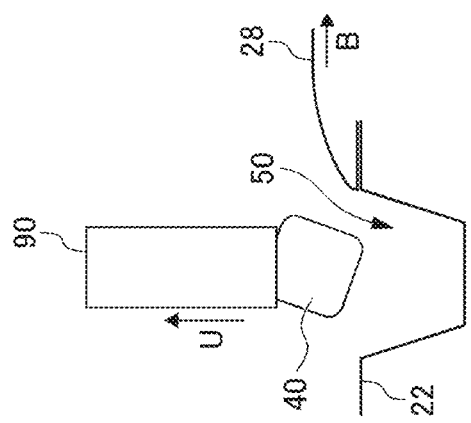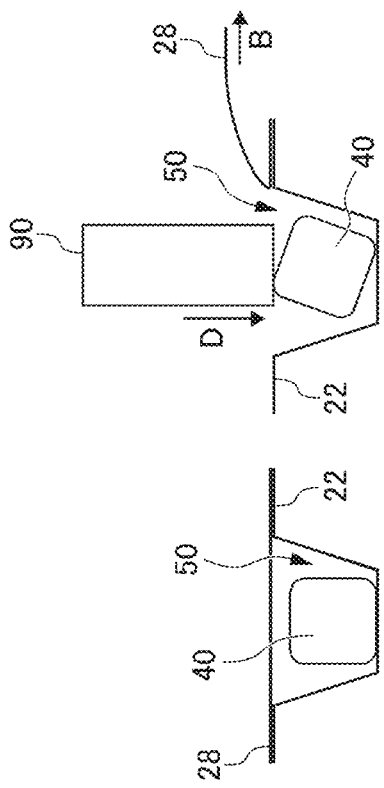

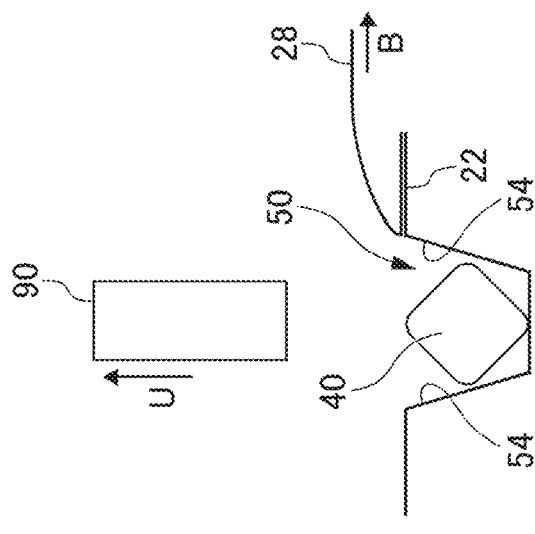
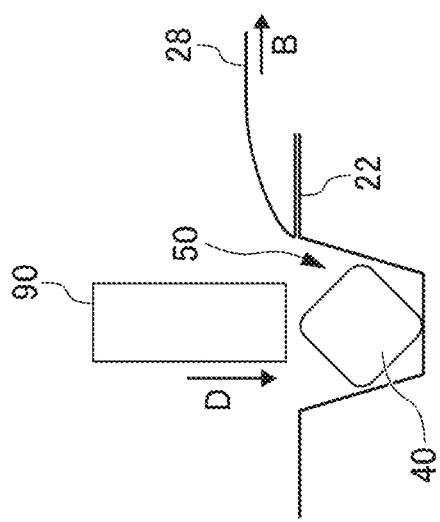
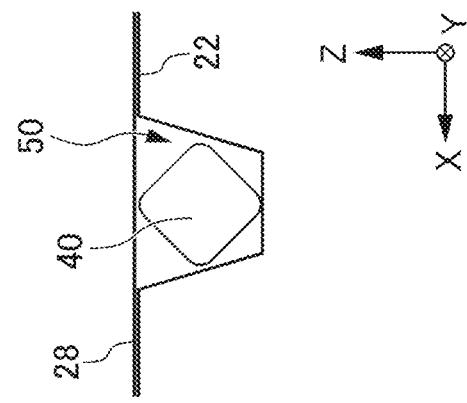

| T1 × T2 | D2 | W2 |
|---|---|---|
| 1.6 × 0.8 | 0.48 ~ 0.58 | 0.026 ~ 0.40 |
| 2.0 × 1.2 | 0.71 ~ 0.81 | 0.037 ~ 0.50 |
| 3.2 × 1.6 | 0.85 ~ 0.95 | 0.047 ~ 0.60 |
| 3.2 × 2.5 | 1.34 ~ 1.44 | 0.071 ~ 0.90 |

FIG.13

| T1 × T2 | L5 | D4 |
|---|---|---|
| 1.6 × 0.8 | 0.9 ~ 1.1 | 0.03 ~ 0.05 |
| 2.0 × 1.2 | 0.9 ~ 1.1 | 0.03 ~ 0.05 |
| 3.2 × 1.6 | 1.9 ~ 2.2 | 0.03 ~ 0.05 |
| 3.2 × 2.5 | 1.6 ~ 2.2 | 0.03 ~ 0.05 |

(mm)

ELECTRONIC COMPONENT PACKAGE

CROSS REFERENCE TO RELATED APPLICATIONS

This application claims the benefit of priority to Japanese Patent Application No. 2022-037392 filed on Mar. 10, 2022. The entire contents of this application are hereby incorporated herein by reference.

BACKGROUND OF THE INVENTION

1. Field of the Invention

The present invention relates to an electronic component package for accommodating an electronic component.

2. Description of the Related Art

Japanese Patent Laid-Open No. 2021-155077 discloses a carrier tape (an electronic component package) aiming at suppression of sticking of an electronic component to a top tape. This publication, however, does not consider stability of a position or an orientation of the electronic component in the inside of a recess for accommodation of the electronic component in the electronic component package.

SUMMARY OF THE INVENTION

Preferred embodiments of the present invention provide electronic component packages that each improve stability of a position or an orientation of an electronic component in the inside of a recess in the electronic component package.

An electronic component package according to a preferred embodiment of the present invention includes a base tape including a plurality of recesses, on an inner surface of each of the plurality of recesses, a protrusion abutting an electronic component inside of the recess is provided, and the electronic component includes a multilayer body having a parallelepiped shape and an external electrode on each of two end surfaces of the multilayer body.

According to preferred embodiments of the present invention, electronic component packages that that each improve stability of a position or an orientation of an electronic component in the inside of a recess in the electronic component package are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a cross-sectional view along the line III-III of the electronic component package shown in FIG. 1.

FIGS. 6A to 6D are diagrams for illustrating failed attachment by suction and cross-sectional views corresponding to the cross-sectional view along the line III-III in FIG. 1.

FIGS. 8A to 8C are diagrams for illustrating diagonal locking and cross-sectional views corresponding to the cross-sectional view along the line III-III in FIG. 1.

FIG. 11 is a diagram showing an exemplary length of each portion a preferred embodiment of the present invention.

FIG. 13 is a diagram showing an exemplary length of each portion in a preferred embodiment of the present invention.

DETAILED DESCRIPTION OF THE PREFERRED EMBODIMENTS

First Preferred Embodiment

Figure 1:
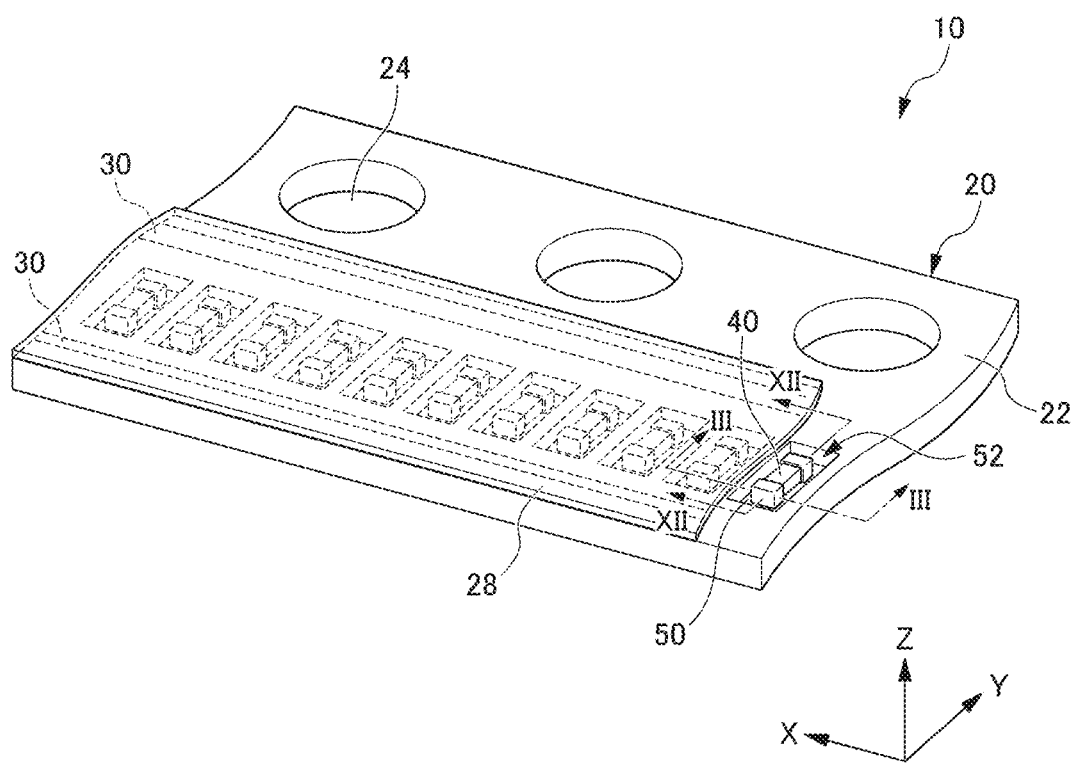
FIG. 1 is a perspective view showing an electronic component series including an electronic component package according to a preferred embodiment of the present invention.

A first preferred embodiment of the present invention will be described below with reference to the drawings. The same or corresponding elements in the drawings are denoted by the same reference characters.

An electronic component package 20 in the present preferred embodiment defines a portion of an electronic component series 10. Electronic component series 10 will initially be described.

Electronic Component Series

As shown in FIG. 1, electronic component series 10 includes electronic component package 20 and an electronic component 40 accommodated in electronic component package 20. Electronic component series 10 has an elongated shape. FIG. 1 shows an XYZ rectangular coordinate. Electronic component package 20 is conveyed in an X direction.

Electronic Component Package

Electronic component package 20 includes a base tape 22 and a cover tape 28.

Base Tape

Base tape 22 includes a recess 50 and a feed hole 24. Electronic component 40 is accommodated in recess 50. Feed hole 24 is used to automatically convey electronic component package 20 in an automatic component supplier.

Recess

Recesses 50 are aligned at prescribed intervals along a longitudinal direction of electronic component package 20, that is, a direction of conveyance of electronic component package 20. The longitudinal direction of electronic component package 20 is shown with a direction X in FIG. 1.

Recesses 50 are arranged disproportionately on one side in a direction of a short side of base tape 22. The direction of the short side of electronic component package 20 is shown with a direction Y in FIG. 1.

In the inside of recess 50, a space in or substantially in a shape of a parallelepiped is provided. Recess 50 will be described in detail later.

Feed Hole

Feed hole 24 is engaged with a tooth for automatic conveyance in the automatic component supplier. As a result of engagement between feed hole 24 and the tooth, electronic component series 10 is conveyed.

Material for Base Tape

Base tape 22 is made of, for example, paper or a resin.

In an example where base tape 22 is made of a resin, the resin is preferably one of polystyrene, polyethylene terephthalate, polycarbonate, and polypropylene. As the base tape is made of such a material, recess 50 is readily shaped. In addition, processes in a clean room can be done.

Cover Tape

Cover tape 28 is bonded to a surface of base tape 22 to cover recess 50. Cover tape 28 is bonded to base tape 22 with a sealing material provided in a sealing portion 30 being interposed. Cover tape 28 is spaced away from feed hole 24 which will be described later.

Material for Cover Tape

Cover tape 28 is made, for example, of polyethylene terephthalate. Cover tape 28 may be made of a material the same or substantially the same as that of base tape 22.

Cover tape 28 is preferably made of a material having a small electrical resistance value. As the cover tape is made of such a material, charging of cover tape 28 can be prevented.

Electronic Component 40

Examples of electronic component 40 accommodated in electronic component package 20 include a resistor, a capacitor, an inductor, a switch, a connector, and a coil. A multilayer ceramic capacitor 401 will be described by way of example of electronic component 40.

Although multilayer ceramic capacitor 401 is described by way of example of electronic component 40 below, electronic component 40 is not limited to multilayer ceramic capacitor 401.

Multilayer Ceramic Capacitor

Figure 2:
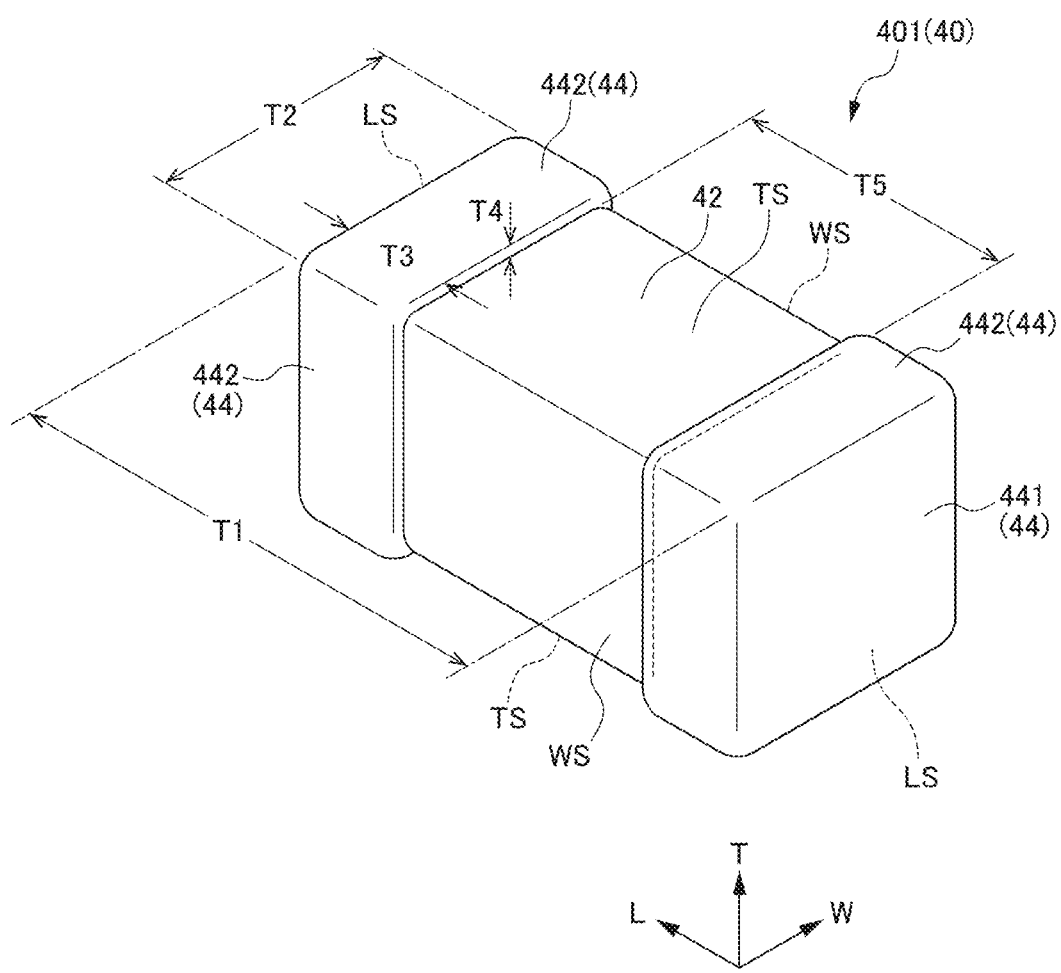
FIG. 2 is a perspective view showing an electronic component accommodated in an electronic component package according to a preferred embodiment of the present invention.

As shown in FIG. 2, multilayer ceramic capacitor 401 includes a multilayer body 42 with an outer geometry in a shape of a parallelepiped and an external electrode 44 provided mainly on each of two opposing surfaces of multilayer body 42.

Definition of Surface and Direction of Multilayer Body

Each of the two surfaces of multilayer body 42 on the entirety of which external electrode 44 is provided is defined as an end surface LS. Two opposing surfaces of four surfaces orthogonal or substantially orthogonal to end surfaces LS are defined as side surfaces WS and main surfaces TS.

A direction in which two end surfaces LS are opposed to each other is defined as a direction of a length L, a direction in which two side surfaces WS are opposed to each other is defined as a direction of a width W, and a direction in which two main surfaces TS are opposed to each other is defined as a direction of layering T.

End-Surface External Electrode and Folded-Over External Electrode

External electrode 44 includes an end-surface external electrode 441 and a folded-over external electrode 442.

End-surface external electrode 441 refers to a portion of external electrode 44 provided on end surface LS. End-surface external electrode 441 is provided on the entire or substantially the entire end surface LS.

External electrode 44 is also provided on a portion of side surface WS and a portion of main surface TS. Folded-over external electrode 442 refers to a portion of external electrode 44 provided on side surface WS or main surface TS. External electrode 44 provided on side surface WS or main surface TS extends from end-surface external electrode 441.

Folded-over external electrode 442 is not provided on the entire or substantially the entire surface of side surface WS and main surface TS but only on a portion thereof.

Size of Multilayer Ceramic Capacitor

In connection with the outer geometry including external electrode 44 of multilayer ceramic capacitor 401, a length in direction of length L is denoted as T1 and a length in direction of width W is denoted as T2.

T1 of multilayer ceramic capacitor 401 is, for example, not shorter than about 0.25 mm and not longer than about 3.20 mm and T2 is not shorter than about 0.125 mm and not longer than about 2.50 mm.

A length in direction of layering T of multilayer ceramic capacitor 401 is, for example, not shorter than about 0.125 mm and not longer than about 2.50 mm.

Dimension of Folded-Over External Electrode

A length in the direction of length L of folded-over external electrode 442 is denoted as T3 and a thickness of folded-over external electrode 442 is denoted as T4.

A length in direction of length L, of a portion of side surface WS or main surface TS of multilayer body 42 where folded-over external electrode 442 is not provided is denoted as T5.

Length T3 and length T4 can be set as appropriate depending on a type of multilayer ceramic capacitor 401.

For example, length T3 representing a width of folded-over external electrode 442 can be not shorter than about 0.20 mm and not longer than about 0.90 mm. Length T4 representing the thickness of folded-over external electrode 442 can be not shorter than about 0.010 mm and not longer than about 0.048 mm.

Characteristics of Electronic Component Package in Present Preferred Embodiment

In electronic component package 20 in the present preferred embodiment, a protrusion 70 is provided in recess 50. Recess 50 will initially be described.

Definition of Shape and Direction of Recess

As shown in FIG. 1, recess 50 has a parallelepiped or substantially parallelepiped shape.

FIG. 1 shows the XYZ rectangular coordinate. A direction shown with a coordinate axis X is defined as a direction of a short side X of recess 50, a direction shown with a coordinate axis Y is defined as a longitudinal direction Y of recess 50, and a direction shown with a coordinate axis Z is defined as a direction of depth Z of recess 50.

Opening of Recess

Recess 50 includes an opening 52 in one surface in direction of depth Z. Opening 52 is rectangular or substantially rectangular in a two-dimensional view. The two-dimensional view means a view of opening 52 in direction of depth Z. The two-dimensional view of opening 52 corresponds to a plan view of opening 52.

Surface of Recess

As shown in FIG. 1, recess 50 includes five inner surfaces.

Figure 4:
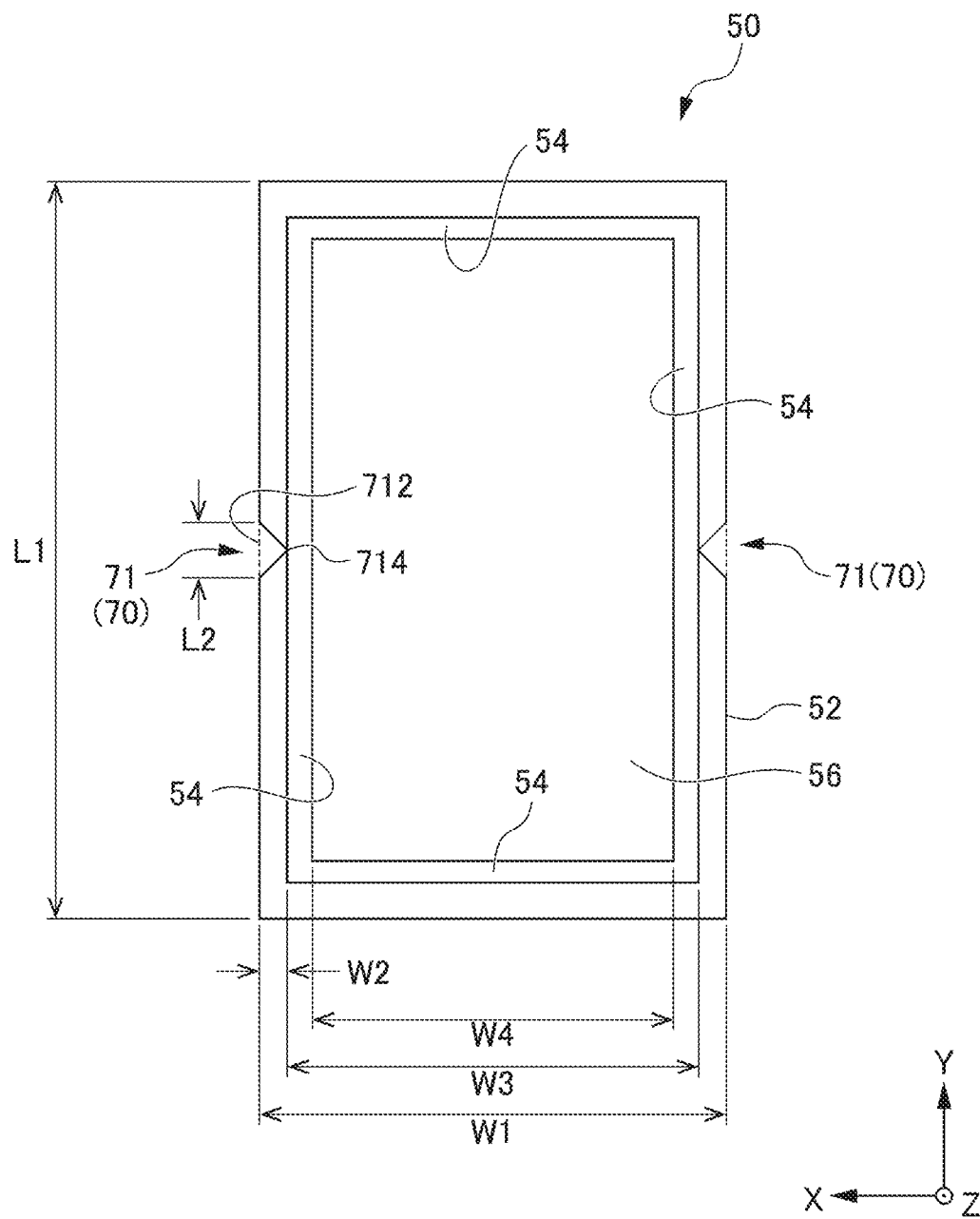
FIG. 4 is a plan view of a recess in a preferred embodiment of the present invention.

As shown in FIGS. 3 and 4, the inner surfaces include four sidewalls 54 and one bottom surface 56. Bottom surface 56 is a surface opposed to opening 52. Sidewall 54 is a surface that extends from bottom surface 56 to opening 52.

Overview of Protrusion

As shown in FIGS. 3 and 4, recess 50 is provided with two protrusions 70. Protrusion 70 means a portion protruding from the inner surface of recess 50 in a direction toward the inside of recess 50.

Sidewall Protrusion and Bottom-Surface Protrusion

Protrusion 70 includes a sidewall protrusion 71 and a bottom-surface protrusion 72.

Sidewall protrusion 71 refers to protrusion 70 provided on sidewall 54 of the inner surfaces of recess 50. Bottom-surface protrusion 72 refers to protrusion 70 provided on bottom surface 56 of the inner surfaces of recess 50.

Sidewall Protrusion

In the present preferred embodiment, sidewall protrusion 71 is provided in recess 50 as protrusion 70. Sidewall protrusion 71 will be described below.

Arrangement of Recess in Longitudinal Direction

As shown in FIG. 4, sidewall protrusion 71 is provided on sidewall 54 that extends in longitudinal direction Y of recess 50. Sidewall protrusion 71 is provided in each of two opposing sidewalls 54. Sidewall protrusion 71 is each provided in a central portion in longitudinal direction Y of sidewall 54.

Therefore, two sidewall protrusions 71 are opposed to each other in direction of short side X of recess 50.

Sidewall protrusion 71 has a triangular or substantially triangular pyramid shape. The bottom surface of the triangular pyramid is located on a side of opening 52 and an apex of the triangular pyramid is located on a side of bottom surface 56.

Arrangement of Recess in Direction of Depth

As shown in FIG. 3, sidewall protrusion 71 is provided on sidewall 54 on the side of opening 52. In other words, sidewall protrusion 71 extends from opening 52 in the direction toward bottom surface 56.

The length in direction of short side X of sidewall protrusion 71 becomes shorter toward bottom surface 56 from opening 52 because the shape of sidewall protrusion 71, such as the triangular or substantially triangular pyramid has the apex on the side of bottom surface 56. A length of sidewall protrusion 71 in direction of short side X represents a height of sidewall protrusion 71.

Details of Protrusion

Sidewall protrusion 71 will more specifically be described below.

Definition of Position

As shown in FIG. 4, when sidewall protrusion 71 is two-dimensionally viewed, an outermost position of recess 50 in direction of short side X is defined as an outer end 712. When sidewall protrusion 71 is two-dimensionally viewed, an innermost position of recess 50 in direction of short side X is defined as an inner end 714.

As shown in FIG. 3, when sidewall protrusion 71 is viewed in cross-section in the Y direction, a position closest to bottom surface 56 in direction of depth Z is defined as a bottom end 716.

Length of Protrusion in Direction of Depth

A length of sidewall protrusion 71 in direction of depth Z will initially be described with reference to FIG. 3.

As shown in FIG. 3, a length in direction of depth Z from opening 52 to bottom surface 56 is denoted as D1, a length of recess 50 in direction of depth Z from opening 52 to bottom end 716 is denoted as D2, and a length of recess 50 in direction of depth Z from bottom end 716 to bottom surface 56 is defined as D3.

In sidewall protrusion 71, D2 is longer than D3. In other words, sidewall protrusion 71 extends from opening 52 in the direction toward bottom surface 56 beyond half D1 which represents the depth of recess 50.

D2 and D3 which represent the length of sidewall protrusion 71 in direction of depth Z preferably satisfy a relationship of D2>D3, and the relation can be set, for example, to D2:D3=6:4.

Length of Protrusion in Direction of Short Side

A length of sidewall protrusion 71 in the direction of the short side will now be described with reference to FIG. 4.

Initially, as shown in FIG. 4, a length of opening 52 in direction of short side X is denoted as W1 and a length of sidewall protrusion 71 in direction of short side X from outer end 712 to inner end 714 is denoted as W2. A length in direction of short side X between two inner ends 714 of two opposing sidewall protrusions 71 is denoted as W3 and a length in direction of short side X of bottom surface 56 is denoted as W4.

Regarding sidewall protrusion 71, length W2 which represents the height of sidewall protrusion 71 is preferably, for example, not shorter than about 0.01 mm and not longer than about 1.00 mm.

A ratio between W1 and W3 which represents a degree of decrease in width of opening 52 by protrusion 70 is preferably within a range from, for example, about 1:0.80 to about 1:0.95.

Relation with Folded-Over External Electrode

Length W2 can be approximately equal to or larger than thickness T4 of folded-over external electrode 442 of multilayer ceramic capacitor 401.

Specifically, length W2 which represents the height of sidewall protrusion 71 can be larger than at least one of thickness T4 of folded-over external electrode 442 on main surface TS and thickness T4 of folded-over external electrode 442 on side surface WS.

Thus, in multilayer ceramic capacitor 401 including folded-over external electrode 442, position displacement or tilt of multilayer ceramic capacitor 401 in the inside of recess 50 can be effectively reduced or prevented.

Length of Protrusion in Longitudinal Direction

A length of sidewall protrusion 71 in longitudinal direction Y will now be described similarly with reference to FIG. 4.

Initially, a length of opening 52 in longitudinal direction Y is denoted as L1 and the length of sidewall protrusion 71 in longitudinal direction Y is denoted as L2.

For example, length L2 is preferably not shorter than about 0.4 mm and not longer than about 1.0 mm.

A ratio between L1 and L2 which represents a degree of the size of protrusion 70 to the length of opening 52 is preferably within a range, for example, from about 1:0.01 to about 1:0.20.

Method of Forming Protrusion

Protrusion 70 including bottom-surface protrusion 72 which will be described later can be provided by using a mold that is used in providing recess 50.

For example, in an example where base tape 22 is made of paper, a shape conforming to protrusion 70 is provided in a compression mold to be used for formation of recess 50. As the compression mold is pressed into base tape 22, recess 50 with protrusion 70 can be formed.

As set forth above, in the example where base tape 22 is made of paper, sidewall protrusion 71 and bottom-surface protrusion 72 can be obtained by a compression mold in a prescribed shape.

In an example where base tape 22 is made of a resin, a shape conforming to protrusion 70 is formed in a mold to be used for resin molding. As base tape 22 is molded based on the mold for resin molding, base tape 22 including recess 50 with protrusion 70 can be formed.

As set forth above, in the example where base tape 22 is made of a resin, sidewall protrusion 71 and bottom-surface protrusion 72 can be obtained with the use of a mold for molding in a prescribed shape.

Advantageous Effects

According to the construction described above, electronic component package 20 in the present preferred embodiment can achieve improved stability of a position or an orientation of electronic component 40 in the inside of recess 50 in electronic component package 20.

This is because electronic component 40 abuts on sidewall protrusion 71 in the inside of recess 50 and the position or the orientation of electronic component 40 is less likely to vary. Occurrence of a fault in removing electronic component 40 from the inside of recess 50 by attachment by suction of electronic component 40 by a nozzle 90 can thus be reduced or prevented. A representative fault will be described below.

Oblique Attachment by Suction

Oblique attachment by suction will initially be described with reference to FIGS. 5A to 5C.

Figure 5C:
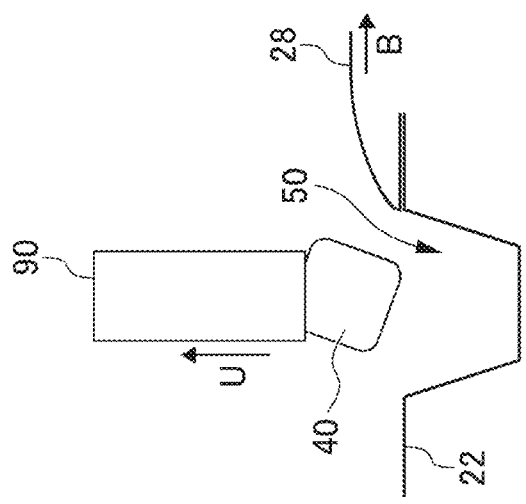
FIGS. 5A to 5C are diagrams for illustrating oblique attachment by suction and cross-sectional views corresponding to the cross-sectional view along the line III-III in FIG. 1.
Figure 5B:
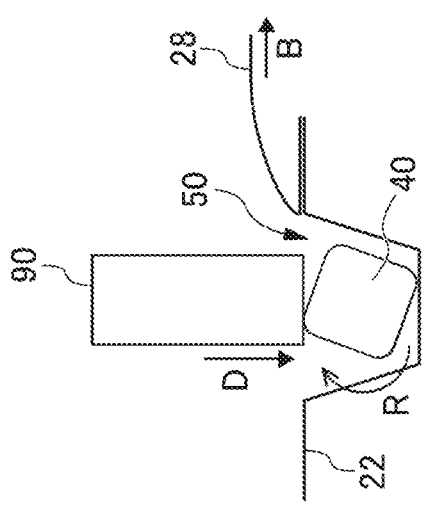
Figure 5A:
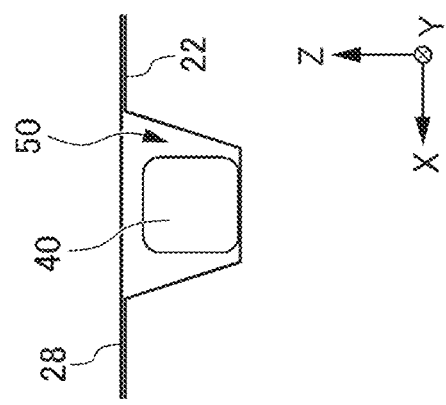

Electronic component 40 is removed from recess 50 by attachment by suction in an order of a state (A), a state (B), and a state (C), that is, in the order of FIGS. 5A to 5C.

In the state (A), electronic component 40 is accommodated in recess 50.

In the state (B), cover tape 28 is peeled off in a direction shown with an arrow B. Then, nozzle 90 moves in a direction shown with an arrow D and attaches electronic component 40 by suction. In attachment by suction, for example, if electronic component 40 is displaced in the inside of recess 50, electronic component 40 may be attached by suction in a turned or skewed state as shown with an arrow R.

As shown in the state (C), while electronic component 40 is attached by suction as being turned, the nozzle moves in a direction shown with an arrow U, which is referred to as oblique attachment by suction.

Failed Attachment by Suction

Failed attachment by suction will now be described with reference to FIGS. 6A to 6D.

Electronic component 40 is removed from recess 50 by attachment by suction in an order of the state (A), the state (B), the state (C), and a state (D), that is, in the order of FIGS. 6A to 6D.

The state (A) to the state (C) are the same as in oblique attachment by suction shown in FIGS. 5A to 5C.

When oblique attachment by suction occurs as in the state (C), and for example, when an angle of turning of electronic component 40 is large, electronic component 40 may fall from nozzle 90.

The state (D) shows a state where electronic component 40 falls from nozzle 90 in a direction shown with arrow D, which is referred to as failed attachment by suction.

Cause of Oblique Attachment by Suction or Failed Attachment by Suction

A cause of oblique attachment by suction and failed attachment by suction will now be described with reference to FIG. 7.

For example, when conveying electronic component series 10 by the automatic component supplier, vibration may cause positional displacement or tilt of electronic component 40 in the inside of recess 50.

When nozzle 90 attempts to attach electronic component 40 by suction while electronic component 40 is displaced or tilted, oblique attachment by suction or failed attachment by suction described above is likely.

Figure 7:
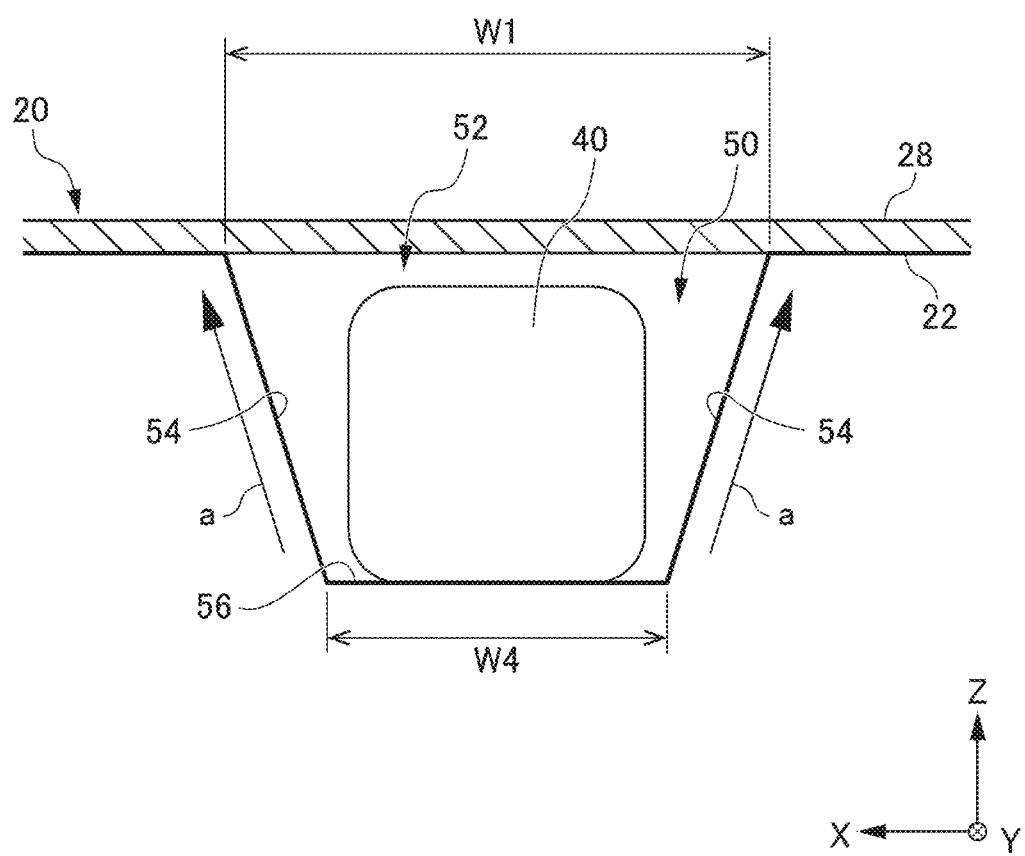
FIG. 7 is a diagram for illustrating a factor for oblique attachment by suction and failed attachment by suction and a cross-sectional view corresponding to the cross-sectional view along the line III-III in FIG. 1.

In particular, as shown in FIG. 7, when the inside of recess 50 is inversely tapered from bottom surface 56 toward opening 52, oblique attachment by suction or failed attachment by suction tends to occur.

For example, in recess 50 shown in FIG. 7, sidewall 54 extends from bottom surface 56 to opening 52 while spreading in a direction shown with an arrow a. Therefore, width W1 of opening 52 is larger than width W4 of bottom surface 56.

When the inside of recess 50 has such a configuration as spreading toward opening 52, electronic component 40 tends to be displaced or tilted in the inside of recess 50.

Consequently, oblique attachment by suction or failed attachment by suction is likely to occur.

Failed Attachment by Suction Due to Diagonal Locking

Failed attachment by suction due to diagonal locking will now be described with reference to FIGS. 8A to 8C. Failed attachment by suction due to diagonal locking represents another fault in attachment by suction of electronic component 40 by nozzle 90.

Electronic component 40 is removed from recess 50 by attachment by suction in the order of the state (A), the state (B), and the state (C), that is, in the order of FIGS. 8A to 8C.

In the state (A), electronic component 40 is accommodated in recess 50. Electronic component 40, however, is accommodated in recess 50 so as to be tilted.

In the state (B), cover tape 28 is peeled off in the direction shown with arrow B, and nozzle 90 moves in the direction shown with arrow D to attach electronic component 40 by suction.

As shown in the state (C), the nozzle moves in the direction shown with arrow U without electronic component 40 being attached by suction, which falls under failed attachment by suction due to diagonal locking.

In the state (A), electronic component 40 is turned in the inside of recess 50. Therefore, electronic component 40 is fitted between two opposing sidewalls 54 of recess 50. Therefore, since suction force by nozzle 90 is not sufficient to attach electronic component 40 by suction, failed attachment by suction due to diagonal locking occurs.

An example in which diagonal locking is likely will be described with reference to FIG. 9.

Figure 9:
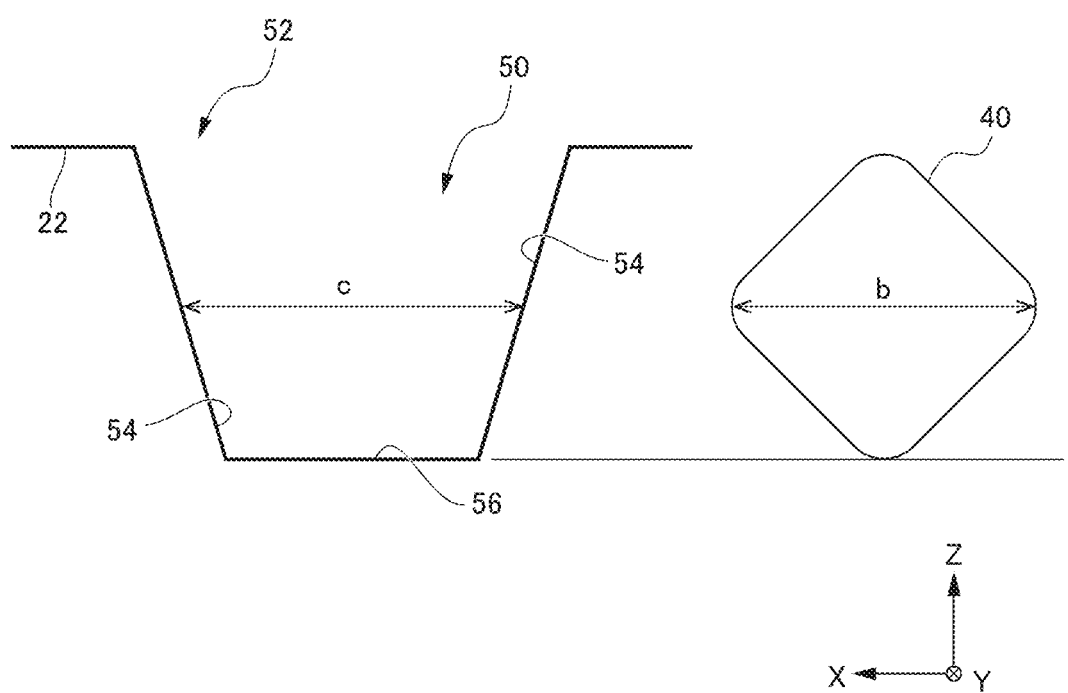
FIG. 9 is a diagram for illustrating a cause of diagonal locking and a cross-sectional view corresponding to the cross-sectional view along the line III-III in FIG. 1.

FIG. 9 shows a length of a diagonal of electronic component 40 with an arrow b. A width in direction of short side X, of a portion of recess 50 in the middle in direction of depth Z is shown with an arrow c.

When the length of arrow b is similar to the length of arrow c, electronic component 40 is likely to fit in recess 50. Consequently, diagonal locking described above is likely to occur.

Recess in Present Preferred Embodiment

The fault described above is less likely to occur in recess 50 according to the present preferred embodiment.

Oblique attachment by suction and failed attachment by suction will initially be described.

In recess 50 in the present preferred embodiment, sidewall protrusion 71 is provided in the vicinity of opening 52. Therefore, even when the inside of recess 50 is in the inversely tapered shape as shown in FIG. 7, electronic component 40 is less likely to be displaced or tilted in the inside of recess 50. Consequently, oblique attachment by suction or failed attachment by suction is less likely to occur.

Furthermore, diagonal locking is also less likely. As described with reference to FIG. 9, diagonal locking tends to occur when length b of the diagonal of electronic component 40 is similar to width c in direction of short side X, of the portion of recess 50 in the middle in direction of depth Z. In order to avoid this, width c may be made larger.

When width c is made larger, however, electronic component 40 tends to be displaced or tilted in the inside of recess 50. Therefore, it is difficult to make width c larger.

In order to address this, in recess 50 in the present preferred embodiment, sidewall protrusion 71 is provided in the vicinity of opening 52. Therefore, even when width c is made larger, position displacement or tilt of electronic component 40 in the inside of recess 50 can be reduced or prevented.

Therefore, occurrence of diagonal locking can be reduced or prevented by making width c larger while occurrence of oblique attachment by suction or failed attachment by suction is reduced or prevented.

Second Preferred Embodiment

Electronic component package 20 according to a second preferred embodiment of the present invention will now be described with reference to FIG. 10. Differences from the first preferred embodiment will mainly be described in the description below.

Figure 10:
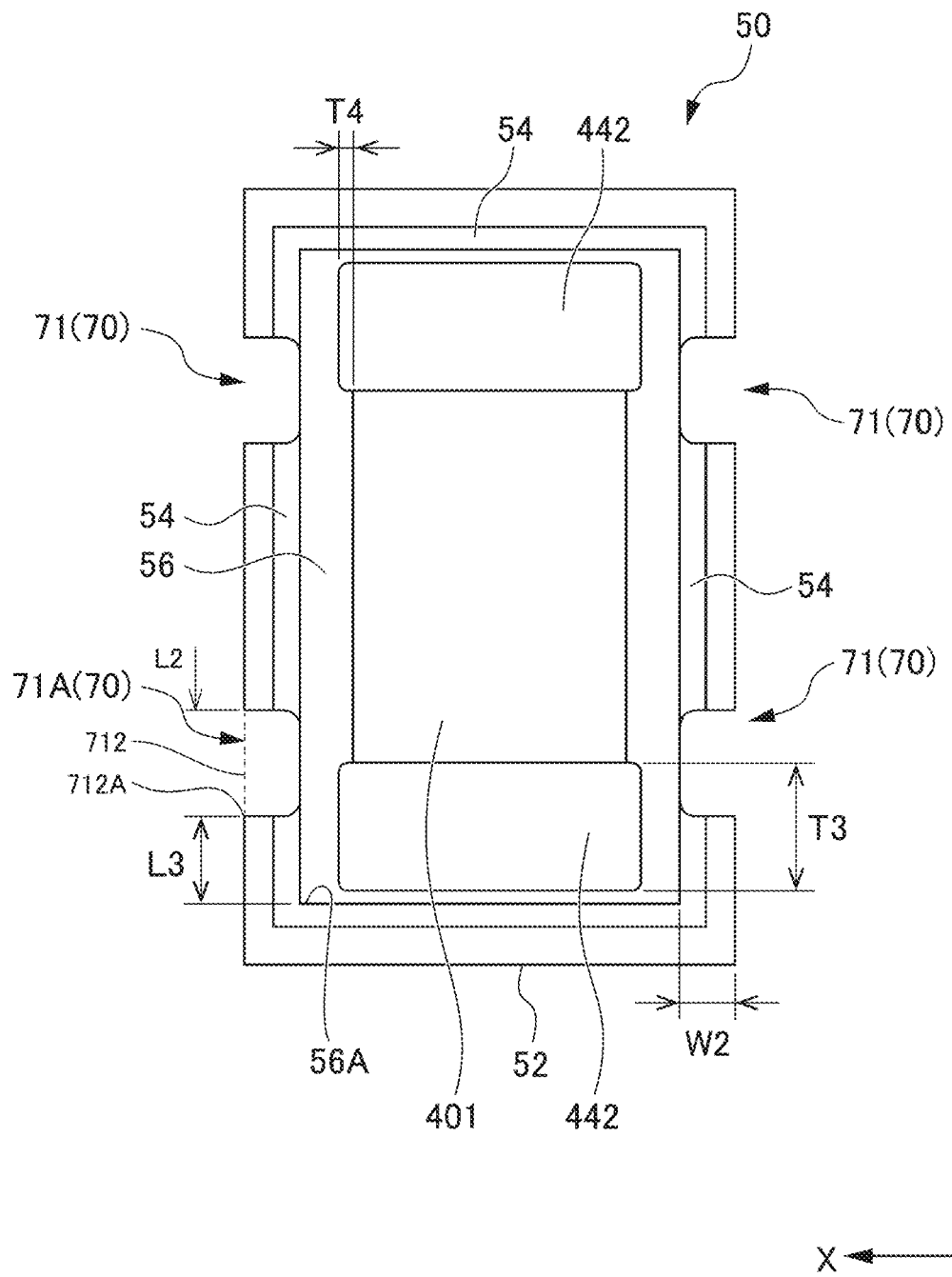
FIG. 10 is a plan view of a recess in a preferred embodiment of the present invention.

As shown in FIG. 10, in the present preferred embodiment, unlike the first preferred embodiment, four protrusions 70 in total, two on each of opposing sidewalls 54, are provided. Sidewall protrusion 71 is quadrangular or substantially quadrangular in a two-dimensional view.

Arrangement of Recess in Longitudinal Direction

As shown in FIG. 10, four sidewall protrusions 71 in total, two on each of sidewalls 54 in longitudinal direction Y, are provided.

With attention being paid to one sidewall protrusion 71, of two contour lines in direction of short side X of bottom surface 56, a contour line closer to the one sidewall protrusion 71 is defined as a reference contour line.

For example, attention is paid to a sidewall protrusion 71A in FIG. 10. The reference contour line in this case is shown as a reference contour line 56A.

At outer end 712 of sidewall protrusion 71A to which attention is paid, outer end 712 closest to reference contour line 56A is defined as a reference outer end 712A.

A length in longitudinal direction Y between reference outer end 712A and reference contour line 56A is denoted as L3. L3 represents a length from the end of bottom surface 56 to sidewall protrusion 71.

In the present preferred embodiment, L2 is equal or substantially equal to L3. In other words, the length in longitudinal direction Y of sidewall protrusion 71 is equal or substantially equal to the length from the end of bottom surface 56 to sidewall protrusion 71.

Four sidewall protrusions 71 in total in similar positional relationships, two on each of two sidewalls 54 extending in longitudinal direction Y, are provided.

A ratio between L2 and L3 is not limited to 1:1, and for example, a range from about 1:1.5 to about 1.5:1 is also applicable.

Relationship with Folded-Over External Electrode

Values of L2 and L3 can be approximately as large as length T3 in direction of length L, of folded-over external electrode 442 of multilayer ceramic capacitor 401.

Thus, in multilayer ceramic capacitor 401 including folded-over external electrode 442, position displacement or tilt thereof in the inside of recess 50 can effectively be suppressed.

Advantageous Effects

In electronic component package 20 in the second preferred embodiment, in multilayer ceramic capacitor 401, in particular in multilayer ceramic capacitor 401 including external electrode 44 that extends to side surfaces WS and main surfaces TS on each of opposing end surfaces LS, stability of the position or the orientation of multilayer ceramic capacitor 401 in the inside of recess 50 can further be improved.

Three-Dimensional Structure of Sidewall Protrusion

In the first preferred embodiment, sidewall protrusion 71 has a triangular or substantially triangular pyramid shape. In contrast, in the present preferred embodiment, sidewall protrusion 71 has a triangular or substantially triangular prism shape.

As shown in FIG. 10, sidewall protrusion 71 is quadrangular or substantially quadrangular in the two-dimensional view. In other words, on a plane flush with opening 52, sidewall protrusion 71 is quadrangular or substantially quadrangular.

Width W2 of sidewall protrusion 71 decreases from opening 52 toward bottom end 716 of sidewall protrusion 71. Width W2 is 0 at bottom end 716.

As set forth above, sidewall protrusion 71 has a three-dimensional structure with the triangular or substantially triangular prism shape that it is quadrangular or substantially quadrangular in a cross-sectional view in direction of depth Z and triangular in a cross-sectional view in longitudinal direction Y.

In the present preferred embodiment, the three-dimensional structure of sidewall protrusion 71 has the triangular or substantially triangular prism shape. Therefore, stability of the position or the orientation of multilayer ceramic capacitor 401 in the inside of recess 50 can further be improved.

The three-dimensional structure of sidewall protrusion 71 is not limited to the triangular or substantially triangular pyramid shape or the triangular or substantially triangular prism shape, and various three-dimensional structures are applicable.

Example

FIG. 11 shows preferred relationships of lengths T1 and T2 of the outer geometry of multilayer ceramic capacitor 401 accommodated in recess 50 and lengths D2 and W2 of portions of sidewall protrusion 71.

Third Preferred Embodiment

Electronic component package 20 according to a third preferred embodiment of the present invention will now be described with reference to FIG. 12. Differences from the preferred embodiments described above will mainly be described in the description below.

The third preferred embodiment is different from the first preferred embodiment in that protrusion 70 is provided on bottom surface 56 not on sidewall 54.

Bottom-Surface Protrusion

Figure 12:
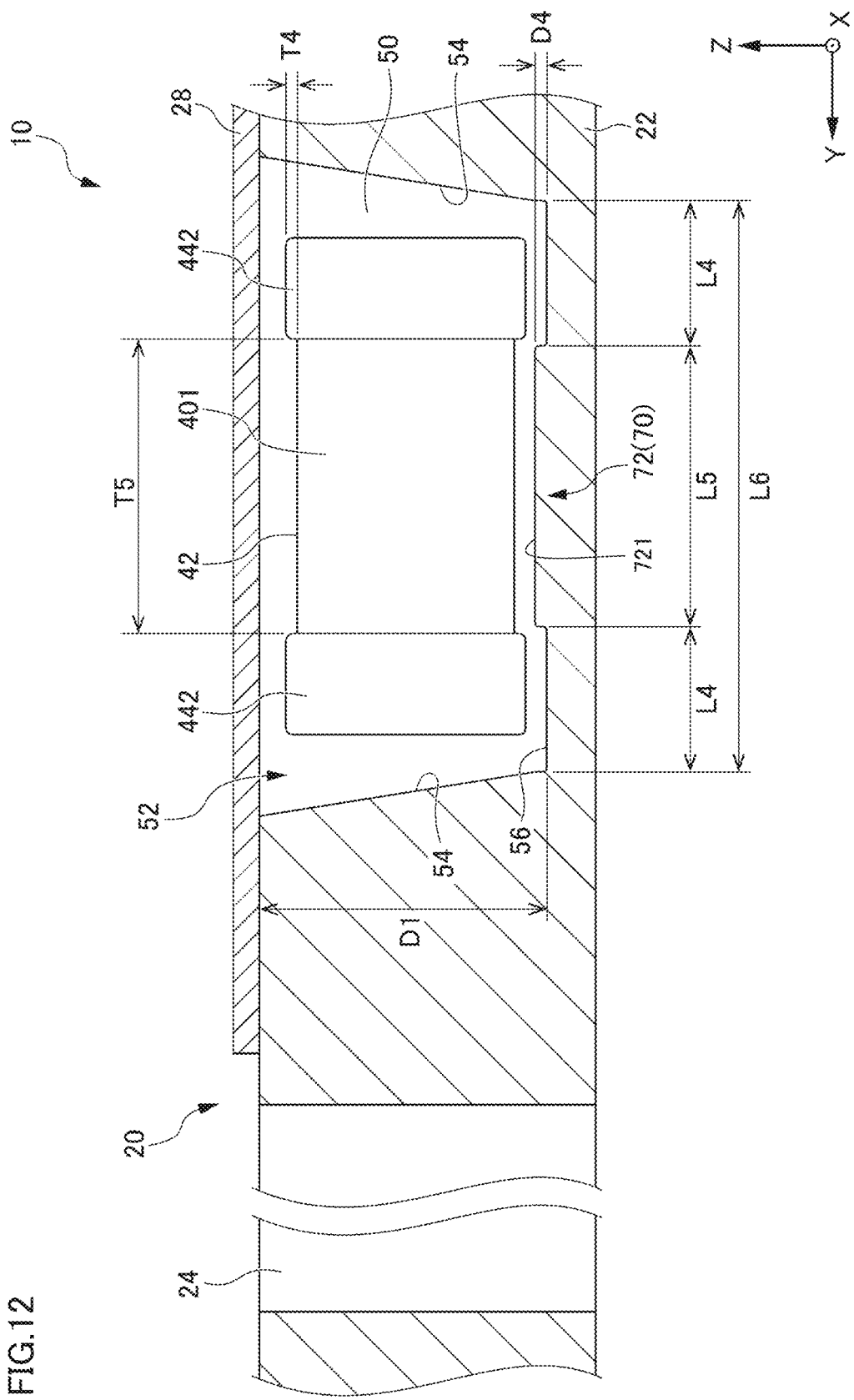
FIG. 12 is a diagram showing a recess in a preferred embodiment of the present invention and a cross-sectional view corresponding to a cross-sectional view along the line XII-XII shown in FIG. 1.

As shown in FIG. 12, in the present preferred embodiment, protrusion 70 is provided on bottom surface 56. This protrusion 70 provided on bottom surface 56 is defined as bottom-surface protrusion 72. In bottom-surface protrusion 72, at least a portion of bottom surface 56 rises in a direction toward opening 52.

Bottom-surface protrusion 72 is quadrangular or substantially quadrangular in a cross-sectional view in direction of short side X. A surface of bottom-surface protrusion 72 that faces opening 52 is defined as a bottom-surface protrusion top surface 721. Bottom-surface protrusion top surface 721 is in parallel or substantially in parallel to bottom surface 56.

Arrangement of Bottom-Surface Protrusion

As shown in FIG. 12, bottom-surface protrusion 72 is provided in a central portion in longitudinal direction Y of bottom surface 56. Bottom-surface protrusion 72 is not provided over the entirety of bottom surface 56 in longitudinal direction Y.

Therefore, there is bottom surface 56 in recess 50 where bottom-surface protrusion 72 is not provided. Bottom surface 56 not provided with bottom-surface protrusion 72 is located on each of sides in longitudinal direction Y, of bottom-surface protrusion 72, that is, between bottom-surface protrusion 72 and each of ends of bottom surface 56.

A length in longitudinal direction Y, of bottom surface 56 of recess 50 is denoted as L6. A length of bottom-surface protrusion 72 in longitudinal direction Y is denoted as L5. A length in longitudinal direction Y, of a portion of bottom surface 56 not provided with bottom-surface protrusion 72 is denoted as L4.

A length in direction of depth Z from bottom surface 56 to bottom-surface protrusion top surface 721 is denoted as D4.

Length of Bottom-Surface Protrusion

Length L5 representing the length of bottom-surface protrusion 72 can be, for example, not shorter than about 0.50 mm and not longer than about 3.00 mm.

Relationship with Folded-Over External Electrode

This length L5 can be approximately equal to or shorter than length T5 of multilayer ceramic capacitor 401 accommodated in recess 50. As described previously, length T5 refers to a length in direction of length L, of the portion of multilayer body 42 where folded-over external electrode 442 is not provided.

By setting of length L5 approximately equal to or shorter than length T5, position displacement or tilt of multilayer ceramic capacitor 401 in the inside of recess 50 is less likely. This is because bottom-surface protrusion top surface 721 abuts on the portion of multilayer body 42 where folded-over external electrode 442 is not provided so that stability of multilayer ceramic capacitor 401 is improved.

A ratio between length L6 and length L5 which represents a ratio of the length over which bottom-surface protrusion 72 is provided on bottom surface 56 can be set, for example, to about 1:0.4 to about 1:0.7.

A ratio between lengths L5 and L4 can be, for example, between about 1:0.5 and about 1:0.8.

Height of Bottom-Surface Protrusion

Length D4 which represents a height of bottom-surface protrusion 72 can be, for example, not shorter than about 0.01 mm and not longer than about 0.10 mm.

Relationship with Folded-Over External Electrode

This length D4 can be approximately equal to or longer than length T4 of multilayer ceramic capacitor 401 accommodated in recess 50. As described previously, length T4 refers to a length corresponding to the thickness of folded-over external electrode 442 provided in multilayer body 42.

Specifically, length D4 which represents the height of bottom-surface protrusion 72 can be greater than at least one of thickness T4 of folded-over external electrode 442 on main surface TS and thickness T4 of folded-over external electrode 442 on side surface WS.

By setting of length D4 approximately equal to or longer than length T4, position displacement or tilt of multilayer ceramic capacitor 401 in the inside of recess 50 is less likely.

By setting of length D4 as described above, both of bottom surface 56 and bottom-surface protrusion top surface 721 can readily abut on multilayer ceramic capacitor 401. Specifically, bottom surface 56 can readily abut on folded-over external electrode 442 and bottom-surface protrusion top surface 721 can readily abut on the portion of multilayer body 42 where folded-over external electrode 442 is not provided. Stability of multilayer ceramic capacitor 401 is thus improved.

Example

FIG. 13 shows preferred relationship between lengths T1 and T2 of the outer geometry of multilayer ceramic capacitor 401 accommodated in recess 50 and lengths L5 and D4 of portions of bottom-surface protrusion 72.

Protrusion and Bottom-Surface Protrusion

Both or any one of sidewall protrusion 71 and bottom-surface protrusion 72 may be provided in recess 50.

For example, an electronic component package where only bottom-surface protrusion 72 is provided in recess 50 can be expressed as below.

Specifically, an electronic component package includes a base tape including a plurality of recesses, each of the recesses is provided with an opening and a bottom surface in parallel or substantially in parallel to the opening, the bottom surface includes a bottom-surface protrusion that rises from the bottom surface in a direction toward the opening, and the electronic component includes a multilayer body having a parallelepiped or substantially parallelepiped shape and an external electrode provided on each of two end surfaces of the multilayer body.

Preferred embodiments of the present invention are not limited to the structures and configurations described above. A mechanism, a shape, a material, a quantity, a position, or arrangement in the preferred embodiments described above may be modified without departing from the scope of technical concepts and features of the present invention, and such modifications are encompassed in the present invention.

For example, sidewall protrusion 71 may be provided on sidewall 54 in direction of short side X of recess 50. Sidewall protrusion 71 may be provided on both of sidewall 54 in longitudinal direction Y of the recess and sidewall 54 in direction of short side X. Sidewall protrusions 71 do not have to be provided at opposing positions in two opposing sidewalls 54. An equal number of sidewall protrusions 71 do not have to be provided on two respective opposing sidewalls 54.

An electronic component package according to a preferred embodiment of the present invention includes a base tape includes a plurality of recesses, on an inner surface of each recess of the recesses, a protrusion that can abut on an electronic component accommodated in the inside of the recess is provided, and the electronic component includes a multilayer body having a parallelepiped or substantially parallelepiped shape and an external electrode provided on each of two end surfaces of the multilayer body.

According to this construction, the protrusion that can abut on the electronic component is provided on the inner surface of the recess. Therefore, the electronic component package in which stability of the position or the orientation of the electronic component in the inside of the recess is improved can be provided.

In an electronic component package according to a preferred embodiment of the present invention, the inner surface includes a sidewall and a bottom surface and the protrusion may be provided on the sidewall.

According to this construction, the protrusion is provided on the sidewall. Therefore, even when the recess is, for example, in such a shape as spreading toward the opening, stability of the position or the orientation of the electronic component in the inside of the recess can be improved.

In an electronic component package according to a preferred embodiment of the present invention, the recess includes an opening, and the protrusion provided on the sidewall may extend from the opening on the sidewall.

According to this construction, the protrusion extends from the opening. Therefore, floating of the electronic component toward the opening in the inside of the recess can be reduced or prevented.

In an electronic component package according to a preferred embodiment of the present invention, the protrusion may be provided on at least one of the sidewall and the bottom surface.

According to this construction, for example, when the protrusion is provided on the bottom surface, the bottom surface can conform to an accommodated electronic component. Therefore, stability of the position or the orientation of the electronic component can further be improved.

In an electronic component package according to a preferred embodiment of the present invention, the recess includes an opening, and the protrusion provided on the bottom surface may be provided with a surface in parallel or substantially in parallel to the opening.

According to this construction, the protrusion on the bottom surface is provided with the surface in parallel or substantially in parallel to the opening. Therefore, stability of the position or the orientation of such an electronic component as including a height difference at the surface can further be improved.

In an electronic component package according to a preferred embodiment of the present invention, the multilayer body includes two main surfaces orthogonal or substantially orthogonal to the end surfaces and opposed to each other and two side surfaces orthogonal to the end surfaces and opposed to each other, the external electrode extends from one end surface to at least a portion of the main surfaces and from the one end surface to at least a portion of the side surfaces, and a height of the protrusion may be larger than at least one of a thickness of the external electrode on the main surfaces and a thickness of the external electrode on the side surfaces.

According to this construction, the height of the protrusion is greater than the thickness of the external electrode on the main surfaces and the like. Therefore, stability of the position or the orientation of the electronic component in which the external electrode is formed also on a surface other than the end surface can further be improved.

In an electronic component package according to a preferred embodiment of the present invention, the base tape may be made of a resin.

According to this construction, the tape is made of a resin. Therefore, the electronic component package can readily be used in a clean room.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component package comprising:
   a base tape including a plurality of recesses; wherein
   on an inner surface of each recess of the plurality of recesses, a protrusion that abuts an electronic component inside of the recess is provided;
   the inner surface includes a sidewall and a bottom surface that intersect with each other;
   the entire protrusion is spaced away from the intersection of the sidewall and the bottom surface;
   the recess includes an opening;
   the protrusion is provided on the sidewall and extends from the opening on the sidewall; and
   the electronic component includes a multilayer body having a parallelepiped or substantially parallelepiped shape and an external electrode on each of two end surfaces of the multilayer body.

2. The electronic component package according to claim 1, wherein a bottom-surface protrusion is provided on the bottom surface.

3. The electronic component package according to claim 2, wherein
   the bottom-surface protrusion includes a surface in parallel or substantially in parallel to the opening.

4. The electronic component package according to claim 1, wherein
   the multilayer body includes two main surfaces orthogonal or substantially orthogonal to the end surfaces and opposed to each other and two side surfaces orthogonal or substantially orthogonal to the end surfaces and opposed to each other;
   the external electrode extends from one end surface to at least a portion of the main surfaces and from the one end surface to at least a portion of the side surfaces; and
   a height of the protrusion is larger than at least one of a thickness of the external electrode on the main surfaces and a thickness of the external electrode on the side surfaces.

5. The electronic component package according to claim 1, wherein the base tape is made of a resin.

6. The electronic component package according to claim 5, wherein the base tape includes polystyrene, polyethylene terephthalate, polycarbonate, or polypropylene.

7. The electronic component package according to claim 1, wherein the base tape is made of paper.

8. The electronic component package according to claim 1, further comprising a cover tape bonded to a surface of the base tape.

9. The electronic component package according to claim 8, wherein the cover tape includes polyethylene terephthalate.

10. The electronic component package according to claim 8, wherein the cover tape is made of a same material as the base tape.

11. The electronic component package according to claim 1, wherein the electronic component is a multilayer ceramic capacitor.

12. The electronic component package according to claim 1, wherein the electronic component has a dimension in a longitudinal direction not shorter than about 0.25 mm and not longer than about 3.20 mm and a dimension in a width direction not shorter than about 0.125 mm and not longer than about 2.50 mm.

13. The electronic component package according to claim 1, wherein the protrusion has a triangular or substantially triangular pyramid shape.

14. The electronic component package according to claim 1, wherein
- a dimension of the opening in a longitudinal direction is denoted as L1 and a dimension of the protrusion in the longitudinal direction is denoted as L2; and
- a ratio between L1 and L2 is in a range from about 1:0.01 to about 1:0.20.

15. The electronic component package according to claim 14, wherein the dimension L2 is not shorter than about 0.4 mm and not longer than about 1.0 mm.

* * * * *